United States Patent [19]
Lipp et al.

[11] Patent Number: 5,764,096
[45] Date of Patent: Jun. 9, 1998

[54] GENERAL PURPOSE, NON-VOLATILE REPROGRAMMABLE SWITCH

[75] Inventors: Robert J. Lipp, Los Gatos; Richard D. Freeman, San Carlos; Robert U. Broze, Santa Cruz; John M. Caywood, Sunnyvale; Joseph G. Nolan, III, San Jose, all of Calif.

[73] Assignee: Gatefield Corporation, Freemont, Calif.

[21] Appl. No.: 754,116

[22] Filed: Nov. 21, 1996

Related U.S. Application Data

[63] Continuation of Ser. No. 270,714, Jul. 5, 1994, abandoned.
[51] Int. Cl.⁶ ..................................................... G11C 11/34
[52] U.S. Cl. .................. 327/434; 365/185.1; 365/185.3; 257/320; 257/321; 257/322
[58] Field of Search ............................ 365/185, 185.1, 365/185.3; 257/318, 319, 320, 321, 322; 327/434

[56] References Cited

U.S. PATENT DOCUMENTS

| | | | |
|---|---|---|---|
| 4,546,454 | 10/1985 | Gupta et al. | 365/185 |
| 4,628,487 | 12/1986 | Smayling | 257/321 |
| 4,979,146 | 12/1990 | Yokoyama et al. | 365/185 |
| 5,005,155 | 4/1991 | Radjy et al. | 257/331 |

*Primary Examiner*—Timothy P. Callahan
*Assistant Examiner*—Jung Ho Kim
*Attorney, Agent, or Firm*—Henry K. Woodward; Townsend and Townsend and Crew, LLP

[57] ABSTRACT

A programmable interconnect which closely integrates an independent switching transistor with separate NVM programming and erasing elements. The programming element is an EPROM transistor and the erasing element is a Fowler-Nordheim tunneling device. A unitary floating gate is shared by the switching transistor and the NVM programming and elements which charge and discharge the floating gate. The shared floating gate structure is the memory structure of the integrated programmable interconnect and controls the impedance of the switching transistor.

15 Claims, 2 Drawing Sheets

GENERAL PURPOSE, NON-VOLATILE REPROGRAMMABLE SWITCH

This is a continuation of application Ser. No. 08/270,714, filed Jul. 5, 1994, now abandoned, the disclosure of which is incorporated by reference.

BACKGROUND OF THE INVENTION

The present invention is related to field programmable integrated circuits, especially Field Programmable Gate Arrays (FPGAs), and more particularly, to floating gate MOS transistors used as switching elements in an FPGA.

Typically, an FPGA has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

Typically an antifuse, such as described in U.S. Pat. No. 5,015,885, which issued to A. El Gamal and S. S. Chiang on May 14, 1991, is used as a programmable interconnect for the wiring and circuit elements of an FPGA. The antifuse integrally combines the functions of a switching element which makes the interconnection and a programming element which stores the state of the switching element, either "off" or "on." Thus an antifuse occupies little space on the integrated circuit, but has the disadvantage of not being reprogrammable. This single-time programmability makes the antifuse difficult to test and unsuitable for a large class of applications where reprogrammability is required.

Alternative programmable interconnects use an MOS (NMOS in all likelihood) transistor as the switching element. The MOS transistor is controlled by the stored memory bit of a programming element. Most commonly, this programming element is a memory cell, a static RAM cell (e.g., see U.S. Pat. No. 4,870,302, which issued to R. H. Freeman on Sep. 26, 1989). However, other RAM cells may be used. For example, a patent application, U.S. Ser. No. 08/032,610, filed Mar. 17, 1993 by Richard D. Freeman describes the use of a dynamic RAM cell as the storage element.

These RAM-based FPGAs are reprogrammable, but the programming of the switching elements is lost whenever power is turned off. A separate storage memory must be used to store the programmed pattern and the FPGA reprogrammed each time it is powered up. Furthermore, these programmable interconnects based on volatile programming elements, such as static RAM and dynamic RAM cells, tend to occupy a large amount of space on the integrated circuit since the switching element cannot be closely integrated with the programming element in most cases.

There is another type of memory cell, the non-volatile reprogrammable transistor memory (NVM). An NVM cell is an MOS transistor with a floating gate which may be charged and/or discharged. Charging and/or discharging the floating gate provides for the non-volatile programmability feature of NVM technologies. NVM technologies have been widely used for memory, and also for programmable logic devices (PLDs) where programming and logic functions are integrated into a single cell structure. PLDs have a very ordered memory-like interconnection structure to implement programmable logic array (PLA) structures directly and are simpler logic arrays than FPGAs. For example, see "A 16 ns CMOS EEPLA with Reprogrammable Architecture," by David L. Rutledge et al., IEEE International Solid-State Circuits Conference, 1986. FPGAs, on the other hand, are typically used to implement random logic and storage register functions, much more complex tasks.

NVM technology has not been applied to FPGAs except as independent memory cells for loading the RAM programming elements which, in turn, control the NMOS switching elements. Existing NVM memory cells can not be used to directly drive the NMOS switching elements because the cells do not have a sufficiently high voltage output. Sense amplifiers must be used to convert the small output signal from a cell to a full voltage digital signal which is then used to load the RAM memory cells.

Therefore, it has not been believed practical to apply NVM technology to create a fully integrated, high performance, general purpose programmable interconnect useful in such applications as an FPGA. In addition to the NVM cell's small output signal, existing NVM PLD technologies rely upon the same conducting paths to perform the programming, as well as the logic functions. There has been no way to separate the conducting paths for the logic functions from the programming functions. This drawback has made the NVM cell unsuitable for providing a general purpose switching element to randomly interconnect FPGA wiring and circuit elements. Furthermore, the high voltages required to program an NVM transistor impose special device engineering and processing constraints so that the transistor can withstand these voltages. Such constraints for high voltage operation, e.g., an increased transistor channel length, inherently degrade performance and renders the NVM transistor a poor choice for a switching element.

On the other hand, the present invention provides for an NVM cell which is suitable as a general purpose programmable interconnect.

SUMMARY OF THE INVENTION

The present invention provides for a novel programmable interconnect which closely integrates an independent switching transistor with separate NVM programming means. An NVM floating gate structure is shared by both the switching transistor and the NVM programming elements which charge and discharge the floating gate. The shared floating gate structure is the memory structure of this integrated programmable interconnect and controls the impedance of the switching transistor. For an NMOS switching transistor, the transistor is turned "on" by removing electrons from the floating gate, thereby increasing its positive charge, to lower the impedance between the source and drain of the switching transistor. Similarly, the switching transistor is turned "off" by adding electrons to the floating gate, making the gate more negative and greatly increasing the switching transistor's source-drain impedance.

DETAILED DESCRIPTION OF PREFERRED EMBODIMENTS

An NVM transistor is erased or programmed by respectively adding or removing electrons from its floating gate. For an n-channel (NMOS) NVM transistor, if electrons are removed from the floating gate, the charge on the gate becomes more positive, turning the transistor on, i.e., reducing the impedance and permitting current to flow across the source-drain terminals of the transistor. This state is commonly referred to as the erased state. If electrons are added, the charge becomes more negative, programming the device by turning the transistor off, i.e., creating a high impedance between the source-drain terminals and inhibiting current flow. These responses make the NVM transistor act like switch. When the transistor is on, the switch is closed; when the transistor is off, the switch is open. For p-channel MOS (PMOS) NVM transistors, the response is similar, except that the polarity of the gate voltage controlling whether the transistor turns on or off is reversed.

Electrons are commonly removed from the floating gate by either Fowler-Nordheim (FN) tunneling through a thin oxide or by exposure to an intense radiation source, such as ultraviolet(UV) light, which stimulates the electrons to a sufficiently high energy level to escape the gate. Electrons are commonly added to the floating gate by either FN tunneling or channel hot electron (CHE) injection.

Figure 1:
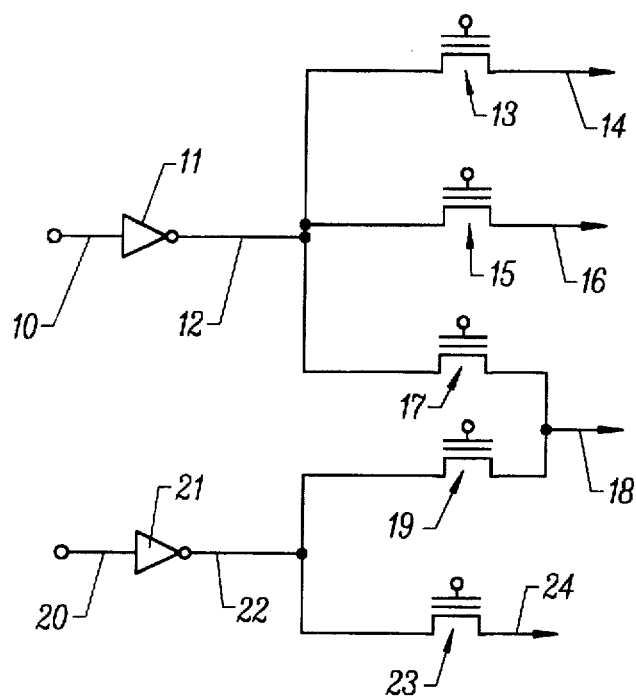
FIG. 1 is an exemplary circuit schematic showing the NVM transistor as a general purpose programmable interconnect.

FIG. 1 illustrates how NVM transistors may ideally be used as a switching element in a circuit, such as an FPGA. An output node 12 of a buffer 11 drives the input nodes of NVM transistor switches 13, 15, 17. These switches 13, 15, 17 have output nodes 14, 16 and 18 respectively, which are further connected to other circuitry, not shown, on the integrated circuit. Similarly, an output node 22 of a buffer 21 drives the input nodes of NVM transistor switches 19 and 23 having output nodes 18 and 24 respectively.

If one or more of the NVM switches 13, 15, and 17 is programmed on, the signal on the buffer output node 12 propagates across these on switches to one or more of the switch output nodes 14, 16, and 18 respectively. Similarly, if either of the NVM switches 19, 24 is programmed on, the signal on the buffer output node 22 propagates to either node 18 or 24 respectively. For example, if it is desired for the signal from the node 22 to propagate to the node 18, the switch 19 is programmed on and the switch 17 programmed off. This programming action is performed prior to the time the buffers 11 and 21 are powered up to prevent uncontrolled voltage swings across the switches. Any of these nodes 14, 16, 18, and 24 may also be connected to the input of other switches and circuitry not shown.

The schematic shown in FIG. 1 illustrates how an ideal NVM transistor switch might be used. Other circuit arrangements may be made. Any number of NVM transistors may be interconnected in any parallel or series arrangement to execute complex switching requirements. The buffer 11 may also be any other type of circuitry, e.g., a NAND gate, capable of delivering a signal to the input of the switches. The input nodes 10 and 20 are connected to other circuitry (not shown) on the integrated circuit.

Unfortunately, there is presently no conventional NVM transistor switch that can be used as illustrated in FIG. 1. Programming a conventional NVM transistor switch requires the transmission of extra programming signals in the switching path. For example, even if the NVM transistor switch were erased using UV erasable EPROM technology, a high voltage, high current signal is still required across the source-drain terminals of the transistor switch to program it by CHE. Therefore, transistor programming requires the disconnection of the switch from the circuit application and connecting the transistor to the programming circuitry. But it is impractical to apply such programming voltages and currents to such a switching device embedded in a randomly interconnected circuit application. Even if a means were discovered to program the switch in this fashion, the design of the switch for programming purposes, capable of withstanding high voltages with an impedance high enough to limit programming currents to reasonable levels, is opposite of the characteristics required for good switch performance, i.e., low impedance and capacitance.

Figure 2:
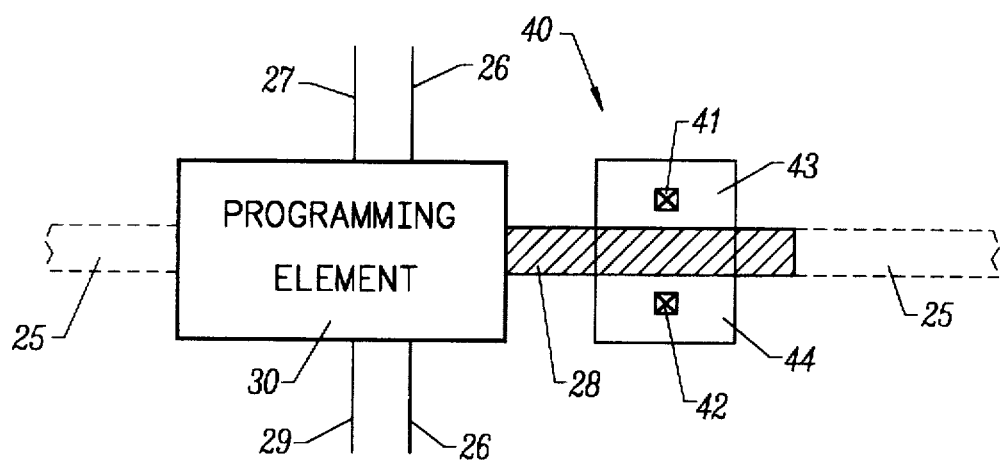
FIG. 2 illustrates the general organization of a programmable interconnect according to one embodiment of the present invention.

FIG. 2 illustrates the general organization of an NVM transistor cell which, according to the present invention, forms a programmable interconnect by which it is possible to use NVM transistor switches as illustrated in FIG. 1. An NVM transistor cell, as described below, is used for each of the NVM transistor switches of FIG. 1. As shown in FIG. 2, the programmable interconnect is formed by a programming element 30 (drawn in a block diagram format), which is separated from a switching element 40 (drawn in a layout format). A floating gate 28 (shaded by diagonal lines), which stores the state of programming of the programmable interconnect, is shared between the switching element 40 and the programming element 30.

The switching element 40, an NVM transistor, is illustrated in FIG. 2 by a simplified integrated circuit layout representation and the programming element 30 by a black box representation. In the switching element 40, a control gate 25, shown by dotted lines where the gate 25 continues beyond the floating gate 28, overlies the floating gate 28 in the area of the switching element 40. The control gate 25 continues into the programming element 30, and to other circuitry on the integrated circuit (not shown).

A source/drain region 43 of the switching element 40, formed by an impurity diffusion into the substrate of the integrated circuit, is connected by a contact 41 to other nodes of the integrated circuit. For example, if the switching element 40 is used as the NVM transistor switch 23 in FIG. 1, the contact 41 is connected to the node 24 of FIG. 1. Similarly, the source/drain region 44, another impurity diffusion into the substrate of the integrated circuit, is connected to other nodes through a contact 42. In the immediate example, this contact is the node 22 in FIG. 1.

The programming element 30 functions to add or subtract electrons from the floating gate 28 which it shares with the switching element 40. The programming element 30 is connected to programming control lines 27, 26, 29 and the control gate 25. In this manner, programming and switching structures of the programmable interconnect are separated and their functions are decoupled from each other. The floating gate structure 28, which stores the programmed state, is shared between the elements 30 and 40. Note, however, that the gate 28 is not directly connected to any other circuit element. Otherwise, the charge on the gate 28 will "leak" off, discharging the gate 28 over time, and lose its programmed state. Also, the capacitive loading of such an interconnection may adversely affect programming performance.

Figure 3:
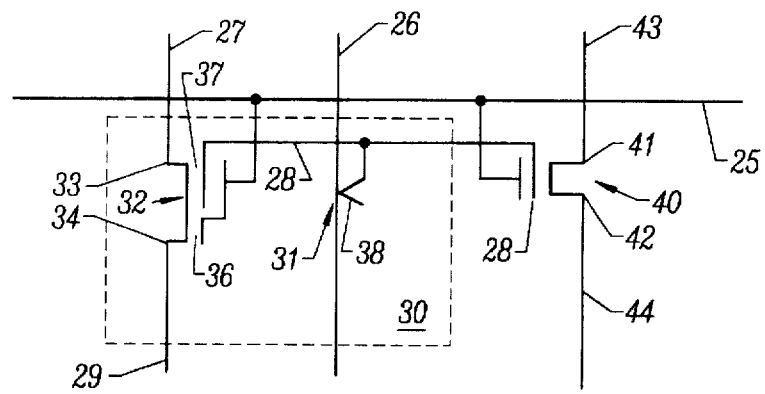
FIG. 3 is a circuit schematic detailing the programmable interconnect of FIG. 2.

FIG. 3 is a schematic representation of the programmable interconnect shown in FIG. 2. It should be noted that in the drawings the same reference numerals are used for the same elements in different drawing formats to facilitate a better understanding of the invention. The switching element 40, an NVM transistor, is directly coupled to the programming element 30 by the floating gate 28. The programming element 30, outlined by a dotted line, has an FN erase device 31 and an EPROM transistor 32, each of which is coupled to the floating gate 28. The voltage on the floating gate 28 is manipulated during programming and erase operations by applying a voltage to the control gate 25 which overlies the floating gate 28 and is capacitively coupled to it. Other ways of coupling voltage to a floating gate are well known and this invention should not be limited to the described coupling only. The polarity and magnitude of the voltage applied to the node 25 directly controls the voltage on the gate 28 through this capacitive coupling. This coupling controls the programming of element 30, and the operating characteristics of the switching element 40.

The floating gate 28 is erased by electrons tunneling across an FN tunnel 38 from the gate 28 to a programming control line 26 when a high positive voltage, with respect to the gate 28, is applied to the line 26. The control gate 25 is typically held at ground voltage during this operation to ensure that the voltage on the gate 28 is near ground potential. The voltage on the floating gate 28 is erased to a positive voltage of about four volts relative to ground (i.e., when the control gate 25, and the source/drain regions 41 and 42 of the switching element 40 are all driven to ground potential, the voltage on the gate 28 remains at +4V). This state of erasure to a voltage state above ground, rather than to ground itself, is called "overerasing" and is strictly avoided in conventional NVM technology. With overerasing, it is more difficult to uniquely select the EPROM programming transistor 32. However, the present invention adapts this otherwise undesirable condition to improve switching performance and operating characteristics.

To overcome the selection problem in charging the floating gate 28, the present invention has a gate region 36 in the EPROM programming transistor 32. The floating gate 28 is programmed by adding electrons to it by CHE in the EPROM transistor 32. In a programming operation, the control gate 25 is raised to a high voltage to turn on the transistor 32. The gate region 36 of the transistor 32 is directly controlled by the control gate 25 while the gate region 37 of the transistor 32 is controlled by the floating gate 28. Both regions 36 and 37 are activated by a positive voltage with respect to the source/drain region 34 (acting as a source) of the transistor 32. As the floating gate 28 is capacitively coupled to the control gate 25, the rise in voltage on the gate 25 further raises the voltage on the floating gate 28 to ensure that the transistor 32 is turned on in the region 37 also. A high voltage on the programming control line 27 and a lower voltage on the line 29 causes a current to flow through the transistor 32, creating hot electrons, some of which are captured by the floating gate 28. These captured hot electrons charge the floating gate 28 negatively.

The charge on the gate 28 becomes so negative that, given sufficient time, the region 37 of transistor 32 is turned off and the transistor 32 stops conducting current. If sufficient time is allowed to fully charge the floating gate 28, its final charge is primarily a function of the voltage on the control gate 25 and the coupling ratio between the control gate 25 and the floating gate 28 (i.e., the percentage of all capacitance of the gate 28 which is coupled to the gate 25). CHE programming is a well understood phenomena and is not described further, except to note that in the preferred embodiment, the final voltage on the floating gate 28, measured with respect to ground as described above, is minus four volts (−4V).

The programming control lines 27 and 29, and the control gate 25 are further connected to other programmable interconnects in the integrated circuit. Each EPROM transistor 32 typically is embedded in an orthogonal matrix of such devices which are uniquely addressed and selected by the gates 25 and programming control line 27 using well known memory addressing technology. The gate region 36 provides for the unique row address selection by the control gate 25. If the gate 25 is driven low, the transistor 32 is not activated, regardless of the voltage on the floating gate 28. Selectively driving the programming control line 27 provides for column address programming selection.

In a similar fashion, the programming control line 26 is also connected to other FN tunnel elements of other programmable interconnects in the integrated circuit. This permits erasing operations to be performed on all of the programmable interconnects at the same time.

While the use of FN tunnel erasing and CHE programming operations are illustrated for the described programmable interconnect, other arrangements are also possible. For example, FN programming or UV erase may be employed. Similarly, the control of the voltage on the floating gate 28 by means of the control gate 25 located above the floating gate should not be implied as a restriction to this invention. Also, the voltages described herein are meant to be illustrative of a programmable interconnect operating in a circuit with a five-volt supply, and are not meant to restrict its use in other operating environments.

Figure 4:
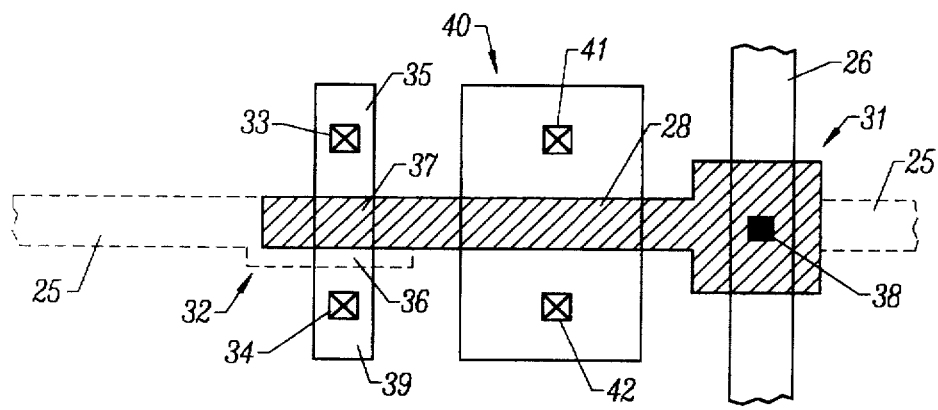
FIG. 4 is a top view of a circuit layout of the programmable interconnect of FIG. 2.

FIG. 4 is a simplified integrated circuit layout of the fully merged and integrated switching and programming elements. In this layout the switching element 40 is shown between the FN device 31 on the right and the EPROM transistor 32. At least in the region of the FN device 31, the programming control line 26 is represented by a substrate diffusion shown by a solid line. The diffusion underlies the floating gate 28 in the form of a polysilicon layer outlined by diagonal lines. The polysilicon floating gate 28 is, in turn, under the control gate 25, a polysilicon layer running horizontally in the drawing and outlined by dotted lines in areas removed from the floating gate 28. Above the floating gate 28, the control gate 25 is coextensive with the gate 28.

The FN tunnel region 38 in the FN device 31 is a thin oxide region underlying the floating gate 28 but overlying diffusion 26. The region 38 is represented by a solid square in the drawing. On the far left side of the FIG. 4 is the EPROM transistor 32. Note that the structure of the EPROM transistor is similar to that of the NMOS transistor forming the switching element 40, except that the control gate 25 extends beyond the floating gate 28 on one side of the transistor to create the gate region 36. This figure clearly shows how the floating gate 28 is shared between all three elements, the switch element 40 and the two devices of the programming element 30, the FN tunnel element 31 and the EPROM transistor 32.

The switching element 40 is coupled to the programming and erasing elements 32 and 31 respectively, but its source-drain terminals are not in the programming or erase circuitry paths. The switching element 40 can be designed to be an independent, high performance, transistor. In particular, the gate oxide thickness and channel length of the transistor is optimized for a high performance, low voltage, switching device, rather than the longer channel lengths and thicker gate oxides required to withstand the relatively high programming and erase voltages. If desirable, the transistor can also be made relatively large so as to minimize its source-drain impedance and further maximize switching performance. Additionally, no components are required to be in series with the switching signal paths (e.g., the node 24 in FIG. 1) nor otherwise attached. Therefore, there is no signal degradation caused by insertion of additional impedance and capacitance in the signal paths.

The use of a floating gate to control the switching transistor has further advantages. The erased and programmed voltages on the floating gate for the preferred embodiment are ±4V respectively, with respect to ground in the unpowered, nonoperating state. This creates an 8V programming voltage swing from the erased state (+4V) to the programmed state (−4V). These voltages are symmetrical above and below ground to give the maximum voltage swing from the programmed state to the erased state while creating the lowest possible voltage across the tunnel oxide during the nonoperating, unpowered state. If these voltages were further increased in magnitude, charge may, over time, leak off the floating gate through the tunnel oxide, partially erasing a programmed device or partially programming an erased device.

As described, the NMOS transistor of the switching element 40 is an intrinsic device, i.e., its threshold voltage is not modified by a dopant implant and is close to zero volts. During normal operation, the control gate 25 is biased such that the voltage on the floating gate of a programmed switch, with respect to ground, is about minus one volt, −1V. For example, with a 75% coupling between the control gate 25 and floating gate 28, the control gate 25 may be set to an operating voltage of +4V to raise the programmed floating gate voltage from −4V to −1V (and the erased floating gate voltage from +4V to +7V). This assures a programmed switch is turned off with an ample voltage margin.

As noted above, the voltage swing from a programmed floating gate to an erased gate is about eight volts. Therefore, with the same operating bias conditions on the control gate 25 as noted above, the voltage on the floating gate 28 of an erased device under normal operating conditions, with zero volts on the source and drain, is about seven volts. This is two volts above the normal five volt operating voltage. During operation, the FN tunnel diffusion, the programming control line 26, is also biased, to about +3V. This limits the voltage swing across the tunnel oxide region 38 during normal operating conditions to about +4V, minimizing charge leakage across the tunnel oxide. Similarly, the EPROM transistor source/drain regions can be connected to a higher bias during operation rather than to ground to limit voltage stress and possible leakage across the EPROM gate during normal operation. The bias on the control gate and on the programming control lines set the operating window the range of voltages between a programmed floating gate and an erased floating gate of the programmable interconnect so that the performance of the switching element transistor is enhanced to conduct full voltage swings across the source/ drains of the transistor, while voltage stress and charge leakage off said floating gate are minimized.

Use of a floating gate, rather than a 5V logic signal, to directly control the switching element transistor 40 further enhances the performance of the switching element transistor by permitting voltages larger than the operating voltages on the floating gate. Seven volts, as described above, on the floating gate of the switching transistor substantially reduces the impedance of the transistor compared to a transistor having its gate driven directly by the 5V operating voltage. Seven volts on the floating gate also permits full 5V operating voltage signals to pass without attenuation through the source-drain terminals of the switching transistor.

In a conventional application where a switch is an NMOS transistor controlled by a five-volt signal on its gate, the switch is unable to pass a full swing signal. A drop in the signal voltage occurs at the source of the switch as compared to the drain. The maximum signal voltage at the source is limited to the gate voltage minus the threshold voltage. For a conventional five-volt operating circuit, the source voltage is thus limited to about +3.5V. Additionally, as the voltage approaches this upper 3.5V limit, the impedance of the transistor switch increases rapidly, substantially increasing the voltage rise time and delaying the signal through the transistor.

In contrast, the use of the floating gate as a control terminal for the switching transistor permits the voltage to be higher than the circuit's operating voltage, high enough such that a full voltage signal can propagate from the drain to the source of the transistor without attenuation. Furthermore, the impedance of the switching transistor is substantially decreased by use of the higher gate voltage, permitting a smaller transistor to be used to achieve the desired "on" switch impedance. This size reduction, as much as 50%, further increases performance. The smaller transistor has less parasitic capacitance and therefore will slow the signal proportionately less than the larger transistor.

Performance is further enhanced by a bootstrapping phenomenon. If a positive signal is applied to one of the source/drain terminals (in this case, the drain by definition) of an "on" switching element 40 to propagate to the other source/drain terminal (here the source), capacitive coupling of the source and drain to the floating gate 28 further increases the voltage on the floating gate 28. In the preferred embodiment, the coupling ratio of the source and drain to the floating gate is approximately 20%. This coupling ratio is selected to ensure an effective bootstrapping of the drain voltage to the floating gate, yet is not so large so as to seriously stress the insulation of the floating gate to create charge leakage path.

The floating gate voltage, in a circuit operating with a five-volt voltage supply, therefore increases by one volt, to about eight volts when transmitting a five-volt signal across the transistor. The erased state voltage of +4V combined with the bias conditions of the control gate 25 ensures that the floating gate voltage is close to +7V. When a positive signal is transmitted through the switching transistor, the floating gate voltage is bootstrapped by about 1V to an +8V level by the capacitive coupling. This +8V gate voltage quickly passes an undistorted signal from the drain to the source, with minimal delay.

Figure 5:
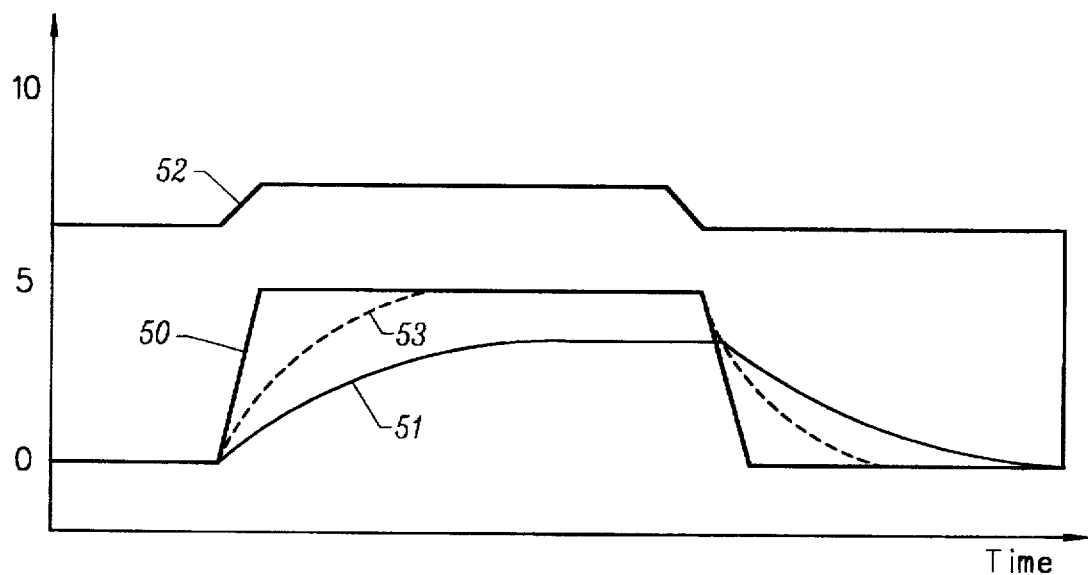
FIG. 5 is a graph of voltage versus time of the programmable interconnect of FIG. 2 to illustrate the effect of voltage bootstrapping on improving the performance of the present invention.

This is illustrated in FIG. 5. A waveform 50 represents a five-volt signal at the drain of the transistor of the switching element 40. Waveform 53 is the signal at the source of the transistor and waveform 52 the signal on the floating gate. An important feature of bootstrapping is that this higher voltage (+8V) never appears across the gate-source junction of the transistor. This further limits voltage stress and possible charge leakage across the transistor gate. Higher performance is achieved without any possible degradation effects of the higher voltages.

Note that if the floating gate voltage were limited to five volts, as in a conventional NMOS pass transistor driven by another logic signal in the 5V operating voltage, the signal is slowed and the voltage attenuated, as shown by waveform 51.

Thus the present invention provides for a programmable interconnect by which an MOS transistor is used as a general purpose switch. The MOS transistor, the switching element, is separated from the means to program the MOS transistor into an off and on state. The switching and programming elements of the programmable interconnect can be independently optimized for switching performance and programming operation respectively. Nonetheless, the switching and programming elements are closely coupled to each other so that the resulting layout occupies substantially less integrated circuit area than fully independent storage and switching elements.

Therefore, while the description above provides a full and complete disclosure of the preferred embodiments of the present invention, various modifications, alternate constructions and equivalents may be employed without departing from the true scope and spirit of the invention. The present invention, therefore, should be limited only by the metes and bounds of the appended claims.

What is claimed is:

1. An integrated circuit having first and second circuit nodes and a programmable interconnect, said programmable interconnect capable of connecting said circuit nodes responsive to a programmed state of said programmable interconnect, said programmable interconnect comprising a first MOS transistor having first and second source/drains connected to the first and second circuit nodes respectively, and a floating gate; and means for charging and discharging said floating gate, said charging and discharging means having no connection to said first and second source/drains of said first MOS transistor, said first MOS transistor remaining on during normal operation of said integrated circuit unless said floating gate has been charged and said first MOS transistor remaining off during normal operation of said integrated circuit unless said floating gate has been discharged.

2. The integrated circuit of claim 1 wherein said charging and discharging means comprises a second MOS transistor having first and second source/drains, a floating gate and a control gate, said first and second source/drains of said second MOS transistor and said control gate of said second MOS transistor being connected to respective programming control lines, and said floating gate of said second MOS transistor being connected to said floating gate of said first MOS transistor.

3. The integrated circuit of claim 2 wherein said floating gates of said first and second MOS transistors form a unitary structure.

4. The integrated circuit of claim 3 wherein said programming lines operate at voltages to only charge said unitary structure.

5. The integrated circuit of claim 1 wherein said charging and discharging means comprises a Fowler-Nordheim tunneling device having a programming control line and an oxide layer, said Fowler-Nordheim tunneling device coupled to said floating gate of said first MOS transistor.

6. The integrated circuit of claim 5 wherein said oxide layer is located between said programming line and a portion of said floating gate of said first MOS transistor.

7. The integrated circuit of claim 6 wherein said programming line operates at voltages to only discharge said floating gate.

8. The integrated circuit of claim 1 wherein said charging and discharging means comprises a second MOS transistor for charging said floating gate of said first MOS transistor, said second MOS transistor having first and second source/drains, a floating gate and a control gate, said first and second source/drains and said control gate of said second MOS transistor being connected to respective programming control lines, and said floating gate of said second MOS transistor being connected to said floating gate of said first MOS transistor; and a Fowler-Nordheim tunneling device for discharging said floating gate of said first MOS transistor, said Fowler-Nordheim tunneling device having a programming control line and an oxide layer, said Fowler-Nordheim tunneling device coupled to said floating gate of said first MOS transistor.

9. The integrated circuit of claim 8 wherein said floating gates of said first MOS transistor and second MOS transistor form a unitary structure, said oxide layer being located between a portion of said unitary structure and said programming line of said Fowler-Nordheim tunneling device.

10. The integrated circuit of claim 9 wherein said first and second MOS transistors each comprise an NMOS transistor.

11. The integrated circuit of claim 10 wherein said programming control line of said Fowler-Nordheim tunneling device is operated so that said floating gate of said first MOS transistor is erased to a positive voltage relative to ground potential when said programmable interconnect is in an unbiased and unpowered state.

12. The integrated circuit of claim 11 wherein said programming control lines operate so that voltages on said floating gate of said first MOS transistor in programmed and erased states are a first negative voltage and a first positive voltage, respectively, said first negative and positive voltages being substantially equal in magnitude with respect to ground potential when said programmable interconnect is in an unbiased and unpowered state.

13. The integrated circuit of claim 12 wherein said programming control lines operate, throughout normal operation of said integrated circuit, to bias voltage on said control gate of said first MOS transistor so that the voltages on said floating gate of said first MOS transistor in programmed and erased states are a second negative voltage and a second positive voltage, respectively, said second negative voltage being smaller in magnitude than said first negative voltage but still sufficient to turn said first MOS transistor off, said second positive voltage being larger in magnitude than said first positive voltage.

14. The integrated circuit of claim 13 wherein, during normal operation of said integrated circuit, said programming control line of said Fowler-Nordheim device is biased to a positive voltage so that voltage stress and charge leakage across said oxide layer are minimized.

15. The integrated circuit of claim 13 wherein said programming control lines of said second MOS transistor are biased to respective positive voltages so that voltage stress and charge leakage across said floating gate of said second MOS transistor are minimized during operation of said programmable interconnect.

* * * * *